(12) United States Patent
Onozuka et al.

(10) Patent No.: US 9,397,057 B2
(45) Date of Patent: Jul. 19, 2016

(54) PLURALITY OF SEMICONDUCTOR DEVICES IN RESIN WITH A VIA

(71) Applicant: Kabushiki Kaisha Toshiba, Minato-ku (JP)

(72) Inventors: Yutaka Onozuka, Yokohama (JP); Hiroshi Yamada, Yokohama (JP); Nobuto Managaki, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/723,738

(22) Filed: May 28, 2015

(65) Prior Publication Data

US 2015/0348924 A1    Dec. 3, 2015

(30) Foreign Application Priority Data

Jun. 2, 2014   (JP) .................................. 2014-114222

(51) Int. Cl.
*H01L 23/00* (2006.01)
*H01L 21/768* (2006.01)
(Continued)

(52) U.S. Cl.
CPC .......... *H01L 24/08* (2013.01); *H01L 21/76802* (2013.01); *H01L 23/04* (2013.01); *H01L 23/3128* (2013.01); *H01L 23/3157* (2013.01); *H01L 23/481* (2013.01); *H01L 23/49816* (2013.01); *H01L 23/49894* (2013.01); *H01L 23/5226* (2013.01); *H01L 23/5383* (2013.01); *H01L 23/5384* (2013.01); *H01L 23/5389* (2013.01); *H01L 24/19* (2013.01); *H01L 24/96* (2013.01); *H01L 23/5329* (2013.01);
(Continued)

(58) Field of Classification Search
CPC . H01L 23/5384; H01L 24/16; H01L 23/3128; H01L 23/49816; H01L 24/06; H01L 24/82; H01L 23/481; H01L 21/486; H01L 23/5329; H01L 23/04; H01L 21/76802; H01L 23/5226; H01L 23/3157
See application file for complete search history.

(56) References Cited

U.S. PATENT DOCUMENTS 6,734,542 B2 * 5/2004 Nakatani ............. H01L 21/4857
174/255
6,818,979 B2 * 11/2004 Takehara ............ H01L 23/3121
257/678

(Continued)

FOREIGN PATENT DOCUMENTS

JP    2003-318323 A    11/2003
JP    2006-148161 A    6/2006

(Continued)

*Primary Examiner* — Alonzo Chambliss
(74) *Attorney, Agent, or Firm* — Oblon, McClelland, Maier & Neustadt, L.L.P.

(57) ABSTRACT

According to an embodiment, a semiconductor device comprises an insulative resin, an interconnect, a plurality of semiconductor elements, a first conductive unit, a first connector, and a first metal layer. The insulative resin includes a first region and a second region. At least a portion of the interconnect is arranged with at least a portion of the first region in a first direction. The first conductive unit pierces the second region in the first direction. At least a portion of the first connector is arranged with at least a portion of the first conductive unit in the first direction. At least a portion of the first connector is arranged with at least a portion of the interconnect in a second direction intersecting the first direction. The first metal layer is provided between the first conductive unit and the first connector. The first metal layer contacts the insulative resin.

20 Claims, 3 Drawing Sheets

(51) Int. Cl.
*H01L 23/31* (2006.01)
*H01L 23/522* (2006.01)
*H01L 23/04* (2006.01)
*H01L 23/48* (2006.01)
*H01L 23/498* (2006.01)
*H01L 23/538* (2006.01)
*H01L 23/532* (2006.01)

(52) U.S. Cl.
CPC ............... *H01L2224/0401* (2013.01); *H01L 2224/04105* (2013.01); *H01L 2224/05025* (2013.01); *H01L 2224/05083* (2013.01); *H01L 2224/05144* (2013.01); *H01L 2224/05155* (2013.01); *H01L 2224/05166* (2013.01); *H01L 2224/12105* (2013.01); *H01L 2224/24137* (2013.01); *H01L 2924/0665* (2013.01); *H01L 2924/07025* (2013.01); *H01L 2924/12* (2013.01)

(56) References Cited

U.S. PATENT DOCUMENTS

| | | | |
|---|---|---|---|
| 7,759,246 B2* | 7/2010 | Matsuki | H01L 23/3114 438/526 |
| 2007/0095471 A1 | 5/2007 | Ito et al. | |
| 2007/0273018 A1 | 11/2007 | Onozuka et al. | |
| 2009/0020882 A1 | 1/2009 | Hasegawa | |
| 2009/0206444 A1 | 8/2009 | Yamada et al. | |
| 2009/0224391 A1* | 9/2009 | Lin | H01L 21/6835 257/690 |
| 2010/0019867 A1 | 1/2010 | Tsuda | |
| 2013/0241083 A1* | 9/2013 | Yu | H01L 24/05 257/780 |
| 2014/0327145 A9* | 11/2014 | Pagaila | H01L 21/56 257/774 |
| 2015/0348937 A1* | 12/2015 | Onozuka | H01L 23/481 257/738 |

FOREIGN PATENT DOCUMENTS

| | | |
|---|---|---|
| JP | 2008-16729 A | 1/2008 |
| JP | 2009-26805 A | 2/2009 |
| JP | 2009-64954 A | 3/2009 |
| JP | 2009-194113 A | 8/2009 |
| JP | 2009-200274 A | 9/2009 |
| JP | 2009-239147 A | 10/2009 |
| JP | 2010-28639 A | 2/2010 |
| JP | 4559993 | 10/2010 |
| JP | 5005521 B2 | 8/2012 |
| JP | 2013-258238 A | 12/2013 |
| WO | WO 2007/043714 A1 | 4/2007 |

* cited by examiner

PLURALITY OF SEMICONDUCTOR DEVICES IN RESIN WITH A VIA

CROSS-REFERENCE TO RELATED APPLICATIONS

This application is based upon and claims the benefit of priority from Japanese Patent Application No. 2014-114222, filed on Jun. 2, 2014; the entire contents of which are incorporated herein by reference.

FIELD

An embodiment of the invention relate to a semiconductor device.

BACKGROUND

Technology called pseudo SOC (System On Chip) has been proposed in which multiple semiconductor elements that are manufactured individually by different processes are arranged and reconfigured as a semiconductor device. It is desirable for the semiconductor device manufactured using pseudo SOC to have high reliability.

DETAILED DESCRIPTION

Figure 1:
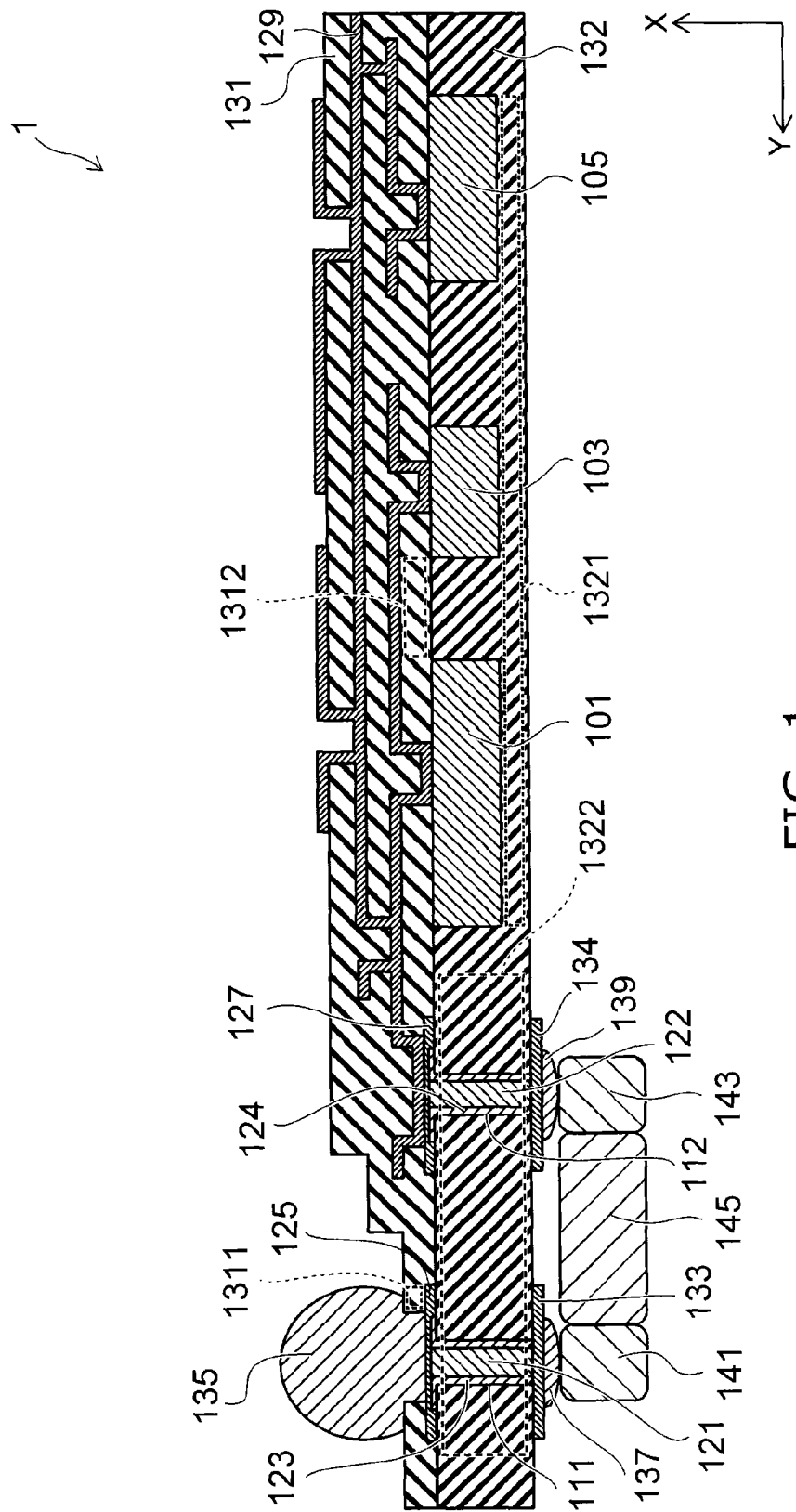
FIG. 1 is a cross-sectional view of a semiconductor device according to the embodiment.

According to an embodiment, a semiconductor device comprises an insulative resin, an interconnect, a plurality of semiconductor elements, a first conductive unit, a first connector, and a first metal layer. The insulative resin includes a first region and a second region. At least a portion of the interconnect is arranged with at least a portion of the first region in a first direction. The first direction intersects a direction from the first region toward the second region. The plurality of semiconductor elements are provided between the first region and the interconnect. At least one of the plurality of semiconductor elements is electrically connected to the interconnect. The first conductive unit pierces the second region in the first direction. At least a portion of the first connector is arranged with at least a portion of the first conductive unit in the first direction. At least a portion of the first connector is arranged with at least a portion of the interconnect in a second direction intersecting the first direction. The first metal layer is provided between the first conductive unit and the first connector. The first metal layer contacts the insulative resin.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even in the case where the same portion is illustrated.

In the drawings and the specification of the application, components similar to those described in regard to a drawing thereinabove are marked with like reference numerals, and a detailed description is omitted as appropriate.

FIG. 1 is a cross-sectional view of a semiconductor device according to the embodiment. The semiconductor device 1 includes an insulative resin 132; and the semiconductor device 1 includes a semiconductor element 101, a semiconductor element 103, and a semiconductor element 105 that are positioned inside the insulative resin 132. Semiconductor elements (e.g., LSI, MEMS, etc.) that have various configurations and functions may be employed as the semiconductor elements 101, 103, and 105. In the description hereinbelow, the semiconductor elements 101, 103, and 105 are called simply "the semiconductor elements" when not particularly differentiated. An interconnect 129 and an organic insulating film 131 are disposed on the semiconductor elements and the insulative resin 132. The insulative resin 132 includes a first region 1321 and a second region 1322. The semiconductor elements 101, 103, and 105 are positioned between the first region 1321 and the interconnect 129. At least one of the semiconductor elements 101, 103, and 105 is electrically connected to the interconnect 129. The insulative resin 132 includes, for example, an epoxy resin. The organic insulating film 131 includes, for example, a photosensitive polyimide, a photosensitive phenol resin, a photosensitive epoxy resin, a photosensitive acrylic resin, etc. The interconnect 129 includes a conductive material and includes, for example, a stacked film of Al and Ti.

Here, a direction that intersects the direction from the first region 1321 toward the second region 1322 is a first direction D1. The first direction D1 is, for example, an X-direction shown in FIG. 1. The interconnect 129 is disposed so that at least a portion of the interconnect 129 is arranged with the first region 1321 in the first direction D1. A first conductive unit 121 is disposed in the second region 1322 of the insulative resin 132 to pierce the second region 1322 in the first direction D1. The first conductive unit 121 is disposed in the interior of a first through-hole 111 to pierce the second region 1322 in the first direction D1. The inner wall of the first through-hole 111 is covered with a first metal film 123. The first conductive unit 121 is formed on the inner side of the first metal film 123 in the first through-hole 111.

It can be confirmed whether or not at least a portion of the interconnect 129 is arranged with at least a portion of the first region 1321 in the first direction D1 by, for example, whether or not a straight line exists that extends in the first direction D1 and passes through a portion of the interconnect 129 and a portion of the first region 1321.

A second conductive unit 122 is disposed in the second region 1322 to pierce the second region 1322 in the first direction D1. The second conductive unit 122 is disposed in the interior of a second through-hole 112 to pierce the second region 1322 in the first direction D1. The inner wall of the second through-hole 112 is covered with a second metal film 124. The second conductive unit 122 is formed on the inner side of the second metal film 124 in the second through-hole 112.

A first connector 135 and a second connector 137 are disposed to be separated from the first conductive unit 121 in the first direction D1. At least a portion of the first connector 135 is arranged with at least a portion of the first conductive unit 121 in the first direction D1. A first metal layer 125 is disposed between the first conductive unit 121 and the first connector 135; and the first conductive unit 121 is electrically connected to the first connector 135 by the first metal layer 125. A second metal layer 133 is disposed between the first conductive unit 121 and the second connector 137; and the first conductive unit 121 is electrically connected to the second connector 137 by the second metal layer 133. The organic insulating film 131 includes a first insulating portion 1311 contacting the first metal layer 125. The organic insulating film 131 also includes a second insulating portion 1312 positioned between the interconnect 129 and the insulative resin 132.

Here, at least a portion of the first connector 135 is arranged with at least a portion of the interconnect 129 in a second direction D2 intersecting the first direction D1. The second direction D2 is, for example, a Y-direction shown in FIG. 1. It can be confirmed whether or not at least a portion of the first connector 135 is arranged with the interconnect 129 in the second direction D2 by, for example, whether or not a straight line exists that extends in the second direction D2 and passes through a portion of the first connector 135 and a portion of the interconnect 129.

A third connector 139 is disposed to be separated from the second conductive unit 122 in the first direction D1. A fourth metal layer 134 is disposed between the second conductive unit 122 and the third connector 139; and the second conductive unit 122 is electrically connected to the third connector 139 by the fourth metal layer 134.

The second conductive unit 122 also is connected to a third metal layer 127. At least a portion of the third metal layer 127 is arranged with at least a portion of the interconnect 129 in the second direction D2. The third metal layer 127 is connected to the interconnect 129. A portion of the first metal film 123 is formed outside the first through-hole 111 and is disposed between the first metal layer 125 and the insulative resin 132. Similarly, a portion of the second metal film 124 is formed outside the second through-hole 112 and is disposed between the third metal layer 127 and the insulative resin 132.

"Connector" means a metal electrode provided to electrically connect an electrode of the semiconductor device to another electrode terminal, etc. The concept of "connector" includes, for example, various electrodes such as ball electrodes formed when forming bump electrodes or bonding wires, metal layers having thick films or columnar metals formed in additional processes, etc.

A passive component 145 includes a first passive component electrode 141 and a second passive component electrode 143. The first passive component electrode 141 is connected to the second connector 137; and the second connector 137 is disposed between the first passive component electrode 141 and the second metal layer 133. The second passive component electrode 143 is connected to the third connector 139; and the third connector 139 is disposed between the second passive component electrode 143 and the fourth metal layer 134. The second connector 137 electrically connects the second metal layer 133 and the first passive component electrode 141; and the third connector 139 electrically connects the fourth metal layer 134 and the second passive component electrode 143.

Accordingly, the first connector 135 is electrically connected to the interconnect 129 via the passive component 145.

The first metal film 123 and the second metal film 124 include, for example, copper; and the first conductive unit 121 and the second conductive unit 122 include, for example, a solder material. Or, the first conductive unit 121 and the second conductive unit 122 may be formed by filling the first through-hole 111 and the second through-hole 112 with copper without forming the first metal film 123 and the second metal film 124. Various metals may be used as the materials of the first metal layer 125, the second metal layer 133, the third metal layer 127, and the fourth metal layer 134.

In some embodiments of the present invention, the semiconductor device comprises an insulative resin having a first region and a second region; and an organic insulating film present on an upper surface of said insulative resin, said organic insulating film having a step configuration, and said organic insulating film having a bottom surface in contact with and on siad upper surface of said insulative resin and said organic insulating film having a top surface, as seen in FIG. 1. Preferred within these embodiments is an embodiment where a bottom portion of the first connector is below the top surface of the organic insulating film, as seen in FIG. 1.

Figure 2:
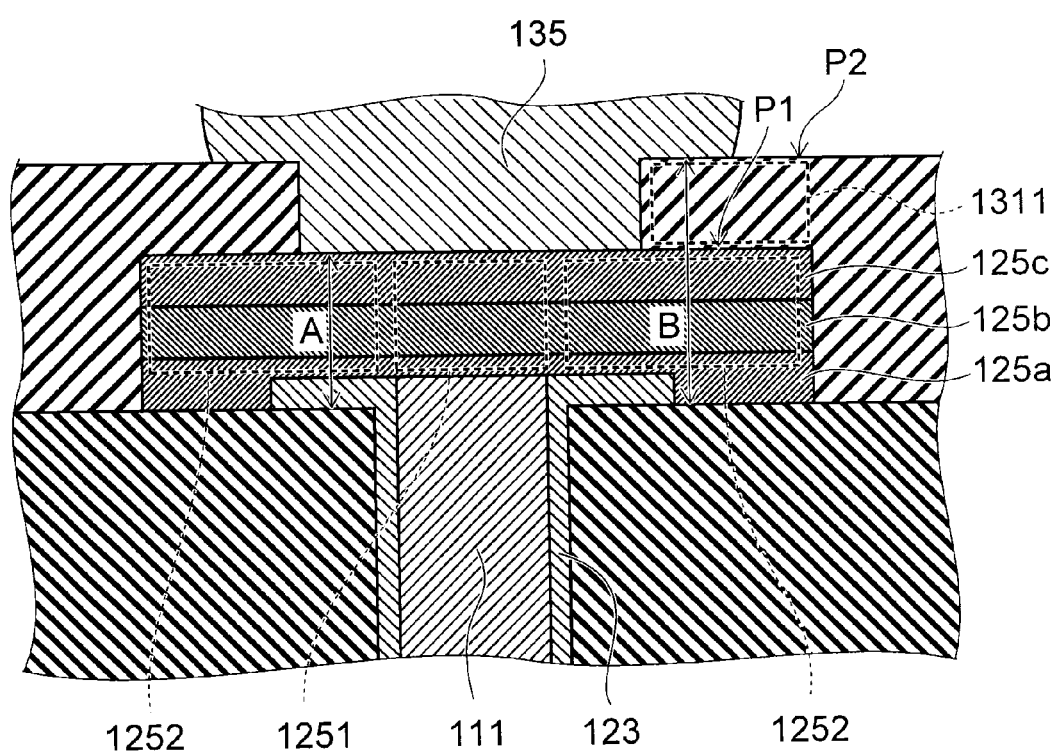
FIG. 2 is an enlarged illustration of the first metal layer 125 and the periphery of the first metal layer 125.

A detailed structure of the first metal layer 125 will now be described using FIG. 2. FIG. 2 is an enlarged illustration of the first metal layer 125 and the periphery of the first metal layer 125. As shown in FIG. 2, the first metal layer 125 includes a titanium (Ti) layer 125a, a nickel (Ni) layer 125b, and a gold (Au) layer 125c. The Ti layer 125a is disposed to improve the adhesion with the first conductive unit 121. The Ni layer is disposed to suppress the diffusion of the metal materials. The Ti layer 125a is disposed between the Ni layer 125b and the insulative resin 132. The Au layer 125c is disposed so that the Ti layer 125a and the Ni layer 125b do not directly contact the first connector. The Ni layer 125b is disposed between the Au layer 125c and the Ti layer 125a. The first connector 135 is disposed to contact the Au layer 125c.

Although only the first metal layer 125 is shown in FIG. 2, it is favorable for the three layers of the Ti layer, the Ni layer, and the Au layer to be disposed in order from the side on which the insulative resin 132 is disposed for the second metal layer 133, the third metal layer 127, and the fourth metal layer as well.

The relationship between the first metal layer 125 and the insulative resin 132 will now be described.

In the embodiment, the first metal layer 125 is formed to directly contact the insulative resin 132. According to such a configuration, peeling of the first metal layer 125 from the insulative resin 132 can be suppressed because the adhesion between the first metal layer 125 and the insulative resin 132 is good.

According to research by the inventors, it was found that a metal layer disposed on an organic insulating film peels easily in a semiconductor device in which multiple semiconductor elements are positioned inside an insulative resin, the organic insulating film and an interconnect are disposed on the insulative resin and the multiple semiconductor elements, and the metal layer and a connector are disposed on the organic insulating film. The peeling of such a metal layer causes operation errors of the semiconductor device and reduces the reliability. Accordingly, it is desirable to develop technology to suppress the peeling of the metal layer positioned on the side of the insulative resin on which the organic insulating film is disposed. According to the semiconductor device according to the embodiment, the peeling is suppressed; and a semiconductor device having high reliability can be provided.

Further, in the semiconductor device according to the embodiment, an epoxy resin in which particles that include silica (e.g., a silica filler) are multiply included is used as the insulative resin 132. The adhesion between the Ti layer 125a included in the first metal layer 125 and the epoxy resin including the particles including silica is good; and in particular, the adhesion is good for the epoxy resin where the particles including silica are positioned at the surface of the insulative resin 132. Accordingly, by employing such a configuration, it is possible to further suppress peeling of the first metal layer 125 from the insulative resin 132.

An example of a method for manufacturing the semiconductor device of the embodiment will now be described.

Figure 3A:
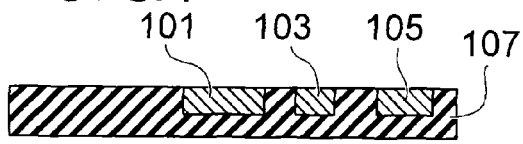
FIGS. 3A to 3M are cross-sectional views of processes, showing manufacturing processes of the semiconductor device according to the embodiment.

First, the semiconductor elements 101, 103, and 105 are prepared; and the semiconductor elements are reconfigured using an insulative resin 107. The configuration at this time is shown in FIG. 3A.

Figure 3B:

Subsequently, as shown in FIG. 3B, a resist pattern 109 is formed on the semiconductor elements and the insulative resin 107.

Figure 3C:
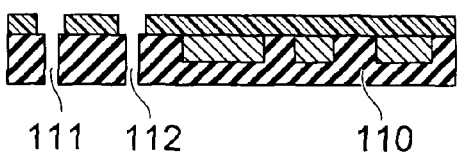

Then, as shown in FIG. 3C, using the resist pattern 109 as a protective film, an insulative resin 110 having the first through-hole 111 and the second through-hole 112 is formed by drilling the insulative resin 107.

Figure 3D:
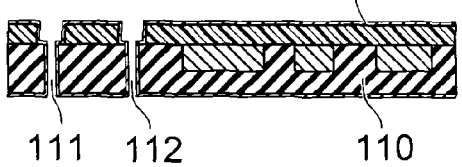

Continuing as shown in FIG. 3D, a metal film 113 is formed by electroless plating to cover the insulative resin 110, the resist pattern 109, the inner wall of the first through-hole 111, and the inner wall of the second through-hole 112.

Figure 3E:
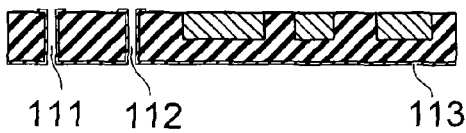

Subsequently, as shown in FIG. 3E, the resist pattern 109 is removed by lift-off.

Figure 3F:
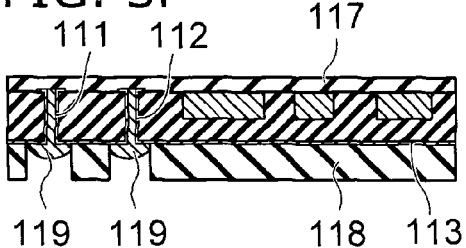

Tape 117 (e.g., polyimide tape) is adhered to the insulative resin 110 in the state of FIG. 3E. Then, a solder resist 118 is formed on the surface of the insulative resin 110 on the side opposite to the surface to which the tape 117 is adhered. Subsequently, solder is filled into the first through-hole 111 and inside the second through-hole 112 by coating solder paste and performing reflow. The configuration at this time is shown in FIG. 3F.

Other than using solder paste, for example, the solder may be filled into the interior of the first through-hole 111 and the interior of the second through-hole 112 by arranging solder balls on the first through-hole 111 and on the second through-hole 112, coating flux for oxidation prevention on the first side, and subsequently performing reflow of the solder balls.

Sn—Ag—Cu which is a standard lead-free solder material may be used as the material of the solder. However, Sn—Cu, Sn—Sb, or the like may be used instead of Sn—Ag—Cu.

Figure 3G:
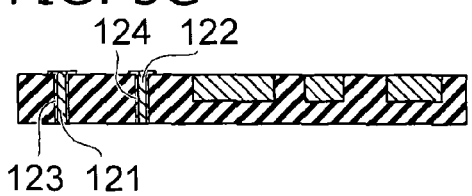

Then, after removing the tape 117 and the solder resist 118, the surface where the solder resist 118 was provided is polished. Thereby, the solder and the metal film 113 formed outside the first through-hole 111 and outside the second through-hole 112 are removed; the first conductive unit 121 remains in the interior of the first through-hole 111; and the second conductive unit 122 remains in the interior of the second through-hole 112. The configuration at this time is shown in FIG. 3G.

Figure 3H:
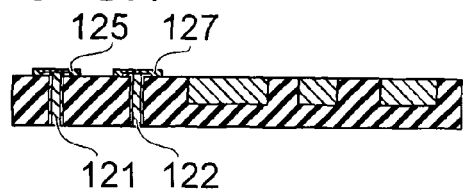

Continuing, a metal film is formed on the semiconductor elements and the insulative resin 110; and by patterning the metal film, the first metal layer 125 that is connected to the first conductive unit 121 is formed; and the third metal layer 127 that is connected to the second conductive unit 122 is formed. The configuration at this time is shown in FIG. 3H.

Figure 3I:
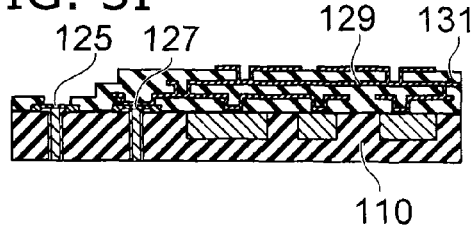

Then, as shown in FIG. 3I, the organic insulating film 131 and the interconnect 129 are formed on the insulative resin 110. At this time, the organic insulating film 131 is patterned so that a portion of the first metal layer 125 is exposed. The third metal layer 127 is connected to the interconnect 129.

Figure 3J:

Subsequently, the insulative resin 110 is polished. Thereby, the insulative resin 132 is made to be thinner than the insulative resin 110. The configuration at this time is shown in FIG. 3J.

Figure 3K:
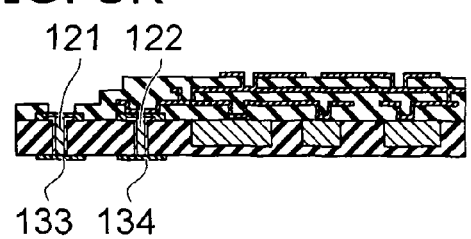

Then, as shown in FIG. 3K, a metal film is formed on the second surface of the insulative resin 132; and by patterning the metal film, the second metal layer 133 that is connected to the first conductive unit 121 is formed; and the fourth metal layer 134 that is connected to the second conductive unit 122 is formed.

Figure 3L:
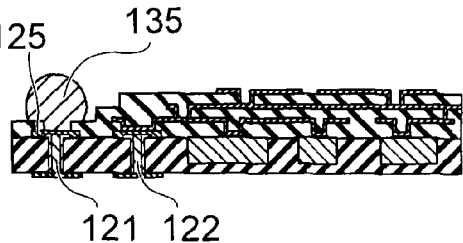

Subsequently, as shown in FIG. 3L, the first connector 135 is formed on the first metal layer 125. In the embodiment, the first connector 135 is formed by providing a solder ball on the first metal layer 125 and performing heat treatment. Here, the first connector 135 includes a material having a melting point that is lower than those of the materials included in the first conductive units 121 and 122. Thereby, the first conductive units 121 and 122 are prevented from melting in the heat treatment when forming the first connector.

Figure 3M:
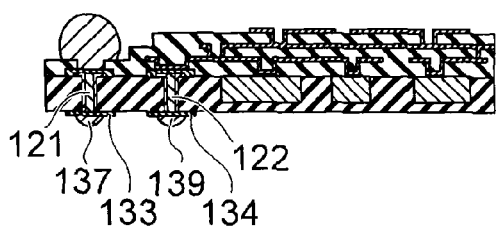

Then, as shown in FIG. 3M, the second connector 137 is formed on the second metal layer 133; and the third connector 139 is formed on the fourth metal layer 134. Similarly to the first connector 135, the second connector 137 and the third connector 139 are formed by first providing solder balls on the second metal layer 133 and the fourth metal layer 134 and performing heat treatment. Also, similarly to the first connector 135, the second connector 137 and the third connector 139 include materials having melting points that are lower than those of the materials included in the first conductive units 121 and 122.

Subsequently, the semiconductor device shown in FIG. 1 is manufactured by connecting the first passive component electrode 141 to the second connector 137 and the second passive component electrode 143 to the third connector 139.

In the semiconductor device according to the embodiment, the first metal layer 125 includes a first portion 1251 that contacts the first conductive unit 121, and a second portion 1252 other than the first portion 1251. The first connector 135 is disposed to contact the first portion. At least a portion of the second portion 1252 is positioned between the first insulating portion 1311 and the insulative resin 132.

Here, the first insulating portion 1311 has a first surface P1 that contacts the second portion 1252, and a second surface P2 on the side opposite to the first surface P1. A distance A in the first direction D1 between the first connector 135 and the insulative resin 132 is shorter than a distance B in the first direction D1 between the second surface P2 and the insulative resin 132.

Therefore, a member for determining the formation position of the first connector 135 is unnecessary when forming the first connector 135 on the first metal layer 125. Conversely, for example, in the case where the upper surface of the first metal layer is continuous with the upper surface of the organic insulating film positioned at the outer circumference of the first metal layer, an alignment member for forming the connector on the first metal layer, e.g., a patterned solder resist, is necessary when forming the connector.

It is possible to reduce the number of processes in the manufacturing processes of the semiconductor device according to the embodiment because the alignment member is unnecessary.

In the method for manufacturing the semiconductor device of the embodiment, the first conductive unit 121 and the second conductive unit 122 are formed by forming the metal film 113 on the inner walls of the first through-hole 111 and the second through-hole 112 and subsequently filling solder 119. However, the method is not limited thereto; and, for example, the first conductive unit 121 and the second conductive unit 122 may be formed by forming the metal film 113 by electroless plating and subsequently filling a metal into the interiors of the first through-hole 111 and the second through-hole 112 by electroplating.

Expectations are high for compact electronic devices having wireless communication functions typified by mobile telephones, personal digital assistants (PDAs), etc., as society approaches a ubiquitous computing society. Therefore, smaller and lighter electronic devices are being developed.

Even more functions and higher performance will continue to be necessary to respond to increasingly diverse needs. The integration of high frequency devices is essential for wireless communication devices. To satisfy these needs, devices having different capabilities are integrated because there is a limit to the performance improvement of a single device. However, it is difficult to form a device having the function of a passive component on an LSI chip. The integration density is low for methods for integrating an LSI chip and a passive component on a substrate. Therefore, technology is desirable to realize high-density integration of heterogeneous devices such as combinations of passive components and LSI chips on one chip.

A first method for integrating heterogeneous devices is called system on chip (SOC). In this method, multiple devices are integrated by all of them being formed directly on one chip. In this method, the integration of the devices is high; and it is possible to downscale the global interconnects between the devices because the global interconnects are formed on the one chip. Therefore, higher integration, higher performance, and a thinner package are possible. However, there is a limit to how much devices can be integrated. For example, it is difficult to form a device based on a different crystal system such as GaAs, etc., on a Si substrate due to differences of the lattice constants and differences of the coefficients of thermal expansion. It is not efficient to use the same processes to make devices requiring high definition design rules such as LSI, etc., and devices formed using low definition design rules. In particular, when embedding a new device, the cost of development is high and the development time is long for the new device because all of the processes are modified.

A second method is called system in package (SIP). In this method, multiple chips are formed separately, subdivided, and mounted on a substrate called an interposer. In this method, there are few limitations on the devices because each of devices can be formed individually. In this method, the development cost can be low and the development time can be short because it is possible to utilize existing chips when developing new systems. However, a density increase of the chip arrangement, downscaling of the interconnects, and a thinner package are difficult to realize because the connections between the interposer and the chips are performed by bonding wires, bumps, etc.

On the other hand, the following method is used in a first reference example. Multiple heterogeneous devices that are formed by each type of manufacturing technology are tested, sorted, and subsequently formed as a reconfiguration wafer using a resin. Further, insulating layers and interconnect layers are formed using semiconductor processes; singulation is performed by dicing; and the modules are completed. In the first reference example, unlike SIP, an interposer is not used. Also, the connections between the devices are performed by interconnects made by semiconductor processes. Thereby, higher integration is possible. In the first reference example, unlike SOC, it is possible to provide heterogeneous devices together. Accordingly, when configuring new systems, it is considered that existing devices can be used; the development time is reduced; and as a result, the development cost can be reduced.

Also, there is the following second reference example. An interconnect layer is formed on a resin wafer; and subsequently, through-vias are formed by making through-holes in the interconnect layer and the resin wafer and by filling the through-vias with a metal. Subsequently, a barrier metal and solder balls are formed on one or both sides of the resin wafer. Thereby, the substrate mounting of the modules are performed; and three-dimensional stacking is possible. Stress fractures that occur in the resin portions fixing the heterogeneous devices are suppressed by forming the solder balls on the resin portion; and the connection reliability of the modules are increased. However, in the second reference example, it was found that the adhesion between the barrier metal and the insulating layer which is the foundation is weak at the solder ball connectors on the interconnect layer side; and connection defects occur due to peeling of the barrier metal when forming the solder balls. In the second reference example, the cost is high because a process of forming a solder resist pattern is used to form the solder balls.

In a pseudo SOC structure in which the semiconductor chips are integrated, the semiconductor chips are reconfigured as a wafer and connected by interconnects. Then, through-vias that pierce the resin portion and the interconnect layer, a barrier metal, and solder balls are formed to three-dimensionally stack such modules. However, for such a conventional structure, it was found that peeling occurs easily between the barrier metal on the interconnect layer side and the insulating film of the foundation.

According to the embodiment, a semiconductor device having high reliability is provided for which it is possible to suppress peeling of the metal layer positioned on the side of the insulative resin where the interconnects are disposed.

Hereinabove, embodiments of the invention are described with reference to specific examples. However, the invention is not limited to these specific examples. For example, one skilled in the art may similarly practice the invention by appropriately selecting specific configurations of components such as the insulative resin, the semiconductor element, the organic insulating film, the interconnect, the conductive unit, the electrode, the connector, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor device, comprising:
an insulative resin having a first region and a second region;
an organic insulating film present on an upper surface of said insulative resin, said organic insulating film having a step configuration, said organic insulating film having a bottom surface in contact with and on said upper surface of said insulative resin and said organic insulating film having a top surface;
an interconnect, where at least a portion of the interconnect is arranged with the first region in a first direction intersecting a second direction from the first region toward the second region;
a plurality of semiconductor elements present between the first region and the interconnect, where at least one of the plurality of semiconductor elements is electrically connected to the interconnect;
a first conductive unit present within the second region in the first direction;
a first connector, where at least a portion of the first connector is arranged with the first conductive unit in the first direction, and at least a portion of the first connector is arranged with at least a portion of the interconnect in the second direction; and
a first metal layer present between the first conductive unit and the first connector connector and contacting the insulative resin,
wherein a bottom portion of said first connector is below the top surface of said organic insulating film.

2. The device according to claim 1, wherein
the insulative resin comprises an epoxy resin; and
the first metal layer contacts the epoxy resin.

3. The device according to claim 1, wherein the insulative resin comprises a plurality of particles, where some of said particles are silica particles.

4. The device according to claim 3, wherein at least a portion of the plurality of particles contacts the first metal layer.

5. The device according to claim 1, wherein the organic insulating film comprises a first insulating portion present between a part of the first connector and the insulative resin in the first direction,
the first metal layer having a first portion and a second portion,
wherein the first portion is present between the first conductor and the first conductive unit in the first direction, the first portion contacting the first conductor and the first conductive unit,
wherein at least a portion of the second portion being present between the first insulating portion and the insulative resin,
wherein a first distance between a first part of the first connector and the insulative resin in the first direction is shorter than a second distance between a second part of the first connector and the insulative resin in the first direction,
wherein the first portion is present between the first part and the insulative resin in the first direction, the first insulating portion being not present between the first part and the insulative resin in the first direction, and
wherein the second portion and the first insulating portion are present between the second part and the insulative resin in the first direction.

6. The device according to claim 5, wherein
the organic insulating film further comprises a second insulating portion, and
the second insulating portion is present between the interconnect and the insulative resin.

7. The device according to claim 5, wherein the first connector contacts the organic insulating film.

8. The device according to claim 5, wherein the organic insulating film comprises a polyimide.

9. The device according to claim 1, wherein the first metal layer is electrically connected to the interconnect.

10. The device according to claim 1, wherein
the first metal layer comprises a titanium layer, and
the titanium layer contacts the insulative resin.

11. The device according to claim 10, wherein
the first metal layer further comprises a nickel layer, and
the titanium layer is present between the insulative resin and the nickel layer.

12. The device according to claim 11, wherein
the first metal layer further comprises a gold layer,
the nickel layer is present between the gold layer and the titanium layer, and
the first connector contacts the gold layer.

13. The device according to claim 1, further comprising:
a second connector; and
a second metal layer,
wherein the first conductive unit is disposed between the first metal layer and the second metal layer,
wherein the second metal layer is disposed between the first conductive unit and the second connector, and
wherein the second metal layer contacts the insulative resin, and
wherein the second metal layer contacts the first conductive unit and the second connector.

14. The device according to claim 13, further comprising:
a second conductive unit present within the second region in the first direction, and
a third metal layer arranged with the interconnect in the second direction and electrically connected to the second conductive unit and the interconnect.

15. The device according to claim 14, wherein the third metal layer contacts the insulative resin.

16. The device according to claim 14, further comprising:
a third connector; and
a fourth metal layer,
wherein the second conductive unit is present between the third metal layer and the fourth metal layer,
wherein the fourth metal layer is present between the second conductive unit and the third connector, and
wherein the fourth metal layer contacts the insulative resin.

17. The device according to claim 16, further comprising a passive component that comprises a first passive component electrode and a second passive component electrode,
wherein the first passive component electrode is connected to the second connector, and
wherein the second passive component electrode is connected to the third connector.

18. The device according to claim 1, wherein a melting point of a material present in the first connector is lower than a melting point of a material present in the first conductive unit.

19. The device according to claim 1, further comprising a metal film present between the insulative resin and a portion of the first metal layer.

20. A semiconductor device, comprising:
an insulative resin having a first region and a second region;
an interconnect, where at least a portion of the interconnect is arranged with the first region in a first direction intersecting a second direction from the first region toward the second region;
a plurality of semiconductor elements present between the first region and the interconnect, at least one of the plurality of semiconductor elements is electrically connected to the interconnect;
a first conductive unit present within the second region in the first direction;

a first connector, at least a portion of the first connector is arranged with of the first conductive unit in the first direction, at least a portion of the first connector is arranged with at least a portion of the interconnect in the second direction intersecting the first direction;

a first metal layer present between the first conductive unit and the first connector and contacting the insulative resin;

a second connector; and a second metal layer;

a second conductive unit present within the second region in the first direction; and a third metal layer arranged with the interconnect in the second direction and electrically connected to the second conductive unit and the interconnect a third connector; and a fourth metal layer, wherein the second conductive unit is disposed between the third metal layer and the fourth metal layer, wherein the fourth metal layer is disposed between the second conductive unit and the third connector, and wherein the fourth metal layer contacts the insulative resin, wherein a passive component comprises a first passive component electrode and a second passive component electrode, wherein the first passive component electrode is connected to the second connector, wherein the second passive component electrode is connected to the third connector, wherein the first conductive unit is present between the first metal layer and the second metal layer, wherein the second metal layer is present between the first conductive unit and the second connector, wherein the second metal layer contacts the insulative resin, wherein the second connector is present between the first passive component electrode and the second metal layer, and wherein the third connector is present between the second passive component electrode and the fourth metal layer.

* * * * *